United States Patent
Walsh et al.

(10) Patent No.: US 8,482,964 B2
(45) Date of Patent: Jul. 9, 2013

(54) ROBUST SRAM MEMORY CELL CAPACITOR PLATE VOLTAGE GENERATOR

(75) Inventors: Kevin K. Walsh, Peoria, AZ (US); Paul F. Gerrish, Phoenix, AZ (US); Larry E. Tyler, Mesa, AZ (US); Mark A. Lysinger, Carrollton, TX (US); David C. McClure, Carrollton, TX (US); Francois Jacquet, Crolles (FR)

(73) Assignees: STMicroelectronics, Inc., Coppell, TX (US); STMicroelectronics SA, Montrouge (FR); Medtronic, Inc., Tempe, AZ (US)

( * ) Notice: Subject to any disclaimer, the term of this patent is extended or adjusted under 35 U.S.C. 154(b) by 573 days.

(21) Appl. No.: 12/645,039

(22) Filed: Dec. 22, 2009

(65) Prior Publication Data

US 2010/0165709 A1    Jul. 1, 2010

Related U.S. Application Data

(60) Provisional application No. 61/142,095, filed on Dec. 31, 2008.

(51) Int. Cl.
*G11C 11/00* (2006.01)
(52) U.S. Cl.
USPC ....... 365/154; 365/156; 365/149; 365/189.09
(58) Field of Classification Search
USPC ............... 365/154, 72, 190, 156, 149, 189.09
See application file for complete search history.

(56) References Cited

U.S. PATENT DOCUMENTS

| | | | |
|---|---|---|---|
| 4,703,456 A * | 10/1987 | Arakawa | 365/185.08 |
| 7,623,405 B2 | 11/2009 | Lysinger et al. | |
| 2008/0198678 A1 | 8/2008 | McClure et al. | |

* cited by examiner

*Primary Examiner* — Kretelia Graham
(74) *Attorney, Agent, or Firm* — Seed IP Law Group PLLC

(57) ABSTRACT

An SRAM having two capacitors connected in series between respective bit storage nodes of each memory cell. The two inverters of the memory cell are powered by a positive voltage and a low voltage. The two capacitors are connected to each other at a common node. A leakage current generator is coupled to the common node. The leakage current generator supplies to the common node a leakage current to maintain a voltage which is approximately halfway between the voltages of the high and low SRAM supplies.

15 Claims, 6 Drawing Sheets

ROBUST SRAM MEMORY CELL CAPACITOR PLATE VOLTAGE GENERATOR

CROSS-REFERENCE TO RELATED APPLICATION

This application claims the benefit under 35 U.S.C. §119(e) of U.S. Provisional Patent Application No. 61/142,095 filed Dec. 31, 2008, where this provisional application is incorporated herein by reference in its entirety.

BACKGROUND

1. Technical Field

The present disclosure relates to a circuit for generating a voltage on a plate of a capacitor coupled to an SRAM memory cell.

2. Description of the Related Art

Static Random Access Memory (SRAM) is used in many applications. SRAM typically consumes little power and has fast read/write times.

FIG. 1 shows a common SRAM cell 20. The SRAM cell 20 comprises a first inverter 26 and a second inverter 28 in a cross-coupled configuration. A bit is stored at the bit storage node 22. The bit storage node 22 is coupled to the input of the first inverter 26 and to the output of the second inverter. A complementary bit node 24 is coupled to the output of the first inverter 26 and the input of the second inverter 28. The complementary bit node 24 carries the opposite value from the bit storage node 22. Each of the inverters is powered by a high supply voltage and a low supply voltage, usually ground. When the bit storage node 22 receives a high voltage, the first inverter 26 outputs a voltage equal to the low supply voltage to the input of second inverter 28. When the input of the first inverter 26 receives a low voltage, the first inverter 26 outputs a voltage equal to the high supply voltage VDD to the input of the second inverter 28. The cross-coupled configuration of the two inverters 26, 28 reinforces the values at the bit storage node 22 and the complementary bit node 24. The reinforcing configuration of the first and second inverters helps ensure the stability of the SRAM cell 20. Access transistors 30 and 32 permit reading from and writing to the memory cell 20.

SRAM can be particularly advantageous compared to other types of random access memory (RAM). Both read and write operations on an SRAM cell are particularly fast compared to read and write operations in other types of memories such as a dynamic random access memory (DRAM) or EEPROM. SRAM cells also do not need to be continuously refreshed. This means that an idle SRAM uses very little power.

Because SRAM is fast for both reading and writing and consumes relatively little power, SRAM is used in a very large variety of systems. Almost all portable electronic devices have one or more SRAM arrays. Most personal computers have one or more SRAM arrays. Modems, calculators, electronic toys, etc. . . . all use SRAM arrays.

In particular, SRAM arrays are finding use in internal medical devices. Internal medical devices such as pacemakers and internal defibrillators employ SRAMs because of the low power consumption and high reliability. The battery in an internal medical device is preferred to be able to last a very long time. Thus a memory array in the internal medical device should consume very little power.

Over the years SRAM cells have been made smaller and smaller. As individual SRAM cells have shrunk, they have become more susceptible to soft errors. One example of a soft error is a memory cell 20 being rewritten when no write process has been called for. Various forms of radiation may by chance encounter the SRAM array and cause a soft error. One common form of radiation that may cause soft errors is an alpha particle. An alpha particle is helium nucleus consisting of two positively charged protons and two neutrons. Thus the alpha particle has a net positive charge. An alpha particle that travels through an SRAM array will cause a multitude of electrons to follow in its wake. If these electrons encounter an input or an output of a memory cell 20 carrying a positive charge, the state of the cell 20 may erroneously be rewritten.

Soft errors can be particularly problematic for internal medical devices carrying SRAM arrays. A person travelling on airplanes, passing through security detectors, X-ray machines or other equipment may be more susceptible to alpha particles or other types of radiation that may destroy the stored data. Improper function of a memory array of an internal defibrillator or pacemaker can be very dangerous to the health of the person in whom the defibrillator or pacemaker is installed.

FIG. 2 illustrates a prior art SRAM cell 34 designed to be more resistant to soft errors. The structure of the SRAM cell 34 in FIG. 2 is similar to that of FIG. 1. But the SRAM cell 34 of FIG. 2 additionally comprises two capacitors 36, 38 coupled in series between the bit storage node 22 and the complementary bit node 24. A common node 44 has a voltage regulator VPLG coupled to it. The function of the two capacitors 36, 38 and the voltage regulator is to further reinforce the value stored at the bit storage node 22. When the bit storage node 22 is high, the first plate 40 of the first capacitor 36 charges to the high value. Stray electrons dragged to the bit storage node 22 by an alpha particle will not be enough to bring the bit storage node 22 low and rewrite the value stored in the cell 34. The excess positive charge stored on the first plate 40 of the first capacitor 36 ensures that bit will not be rewritten. If the bit storage node 22 is low, then the complementary bit node 24 is high and the first plate 42 of the second capacitor 38 is charged to the high value while the first plate 40 of the first capacitor 36 is brought low.

As can be seen in FIG. 2, the second plates 46, 48 of the first and second capacitors 36, 38 are both coupled to the common node 44. The second plates 46, 48 receive a capacitor supply voltage VPLG from a voltage regulator, not shown in this figure. The capacitor supply voltage VPLG is approximately midway between the high supply voltage VDD and the low supply voltage GND. Thus the second plates 46, 48 of the capacitors 36, 38 are continuously driven by a voltage regulator with feedback and bias currents to be held at a voltage midway between VDD and GND. This configuration further reinforces the value stored at the bit storage node 22.

Generating and supplying the capacitor supply voltage VPLG in the prior art has been very power intensive. A full regulated power supply with various feedback paths is used. Such a power supply has bias currents, various current mirrors, feedback paths and other circuits that are assured of maintaining the voltage, but at significant power cost. The power supply for VPLG thus consumes a large amount of power even through its sole use is to hold data in the SRAM cell. An SRAM that consumes more power may be unsuitable for use in internal medical devices.

BRIEF SUMMARY

One embodiment of the invention includes an SRAM having two capacitors connected in series between respective bit storage nodes of each memory cell. The two inverters of the memory cell are powered by a positive voltage and a low voltage. The two capacitors are connected to each other at a common node. A leakage current generator is coupled to the common node. The leakage current generator supplies to the common node a leakage current to maintain a voltage which is approximately halfway between the voltages of the high and low SRAM supplies.

In one embodiment, the leakage current generator comprises a transistor that supplies the common node with a sub-threshold leakage current.

In one embodiment the leakage current generator is powered by a voltage that has been reduced below the full positive voltage rail and a voltage that has been increased above the low voltage rail. The SRAM cells are also powered by the same reduced voltages. The midpoint of the reduced positive voltage rail and the increased low voltage rail will therefore match the midpoint node of the SRAM cell since it is driven by the same voltages. This voltage may be the same as the midpoint between the full high positive rail and the full low rail and it may also be different. The difference between the reduced positive voltage rail and the increased low voltage rail is less than the difference between the high positive rail and the low rail so that much less power is consumed by operation of such a leakage current generator if the full high rail and the low rail voltages are used.

In one embodiment a single large leakage current generator is coupled to the common nodes of all memory cells in the array and all common nodes are coupled to each other. In an alternative embodiment, the SRAM may be divided into a plurality of blocks of memory cells. Each block of memory cells has a separate leakage current generator associated with the memory cells of the block. Each block may be powered at a different VDD or GND level.

In one embodiment the leakage current generator comprises two PMOS transistors connected in series and configured to be off. A leakage current flows between the two PMOS transistors and generates, at the common connection of the two transistors, the leakage current voltage.

In one embodiment the leakage current generator comprises an NMOS transistor and a PMOS transistor connected in series and both configured to be off. A leakage current flows between the NMOS and PMOS transistors and generates, at the common connection of the two transistors, the leakage current voltage.

In one embodiment the leakage current generator comprises two NMOS transistors connected in series and configured to be off. The leakage current generator further comprises two PMOS transistors connected in series and configured to be off. The NMOS and the PMOS transistors are connected together at a common node. A leakage current of the PMOS and NMOS transistors generates the leakage current voltage.

One embodiment is an internal medical device having an SRAM comprising a leakage current generator configured to generate a capacitor supply voltage from a sub-threshold leakage current of a transistor configured to be off. In one embodiment the leakage current voltage is midway between a high voltage supply and a low voltage supply of an SRAM cell. In other embodiments the internal medical device is an internal defibrillator or an internal pacemaker.

DETAILED DESCRIPTION

Figure 1:
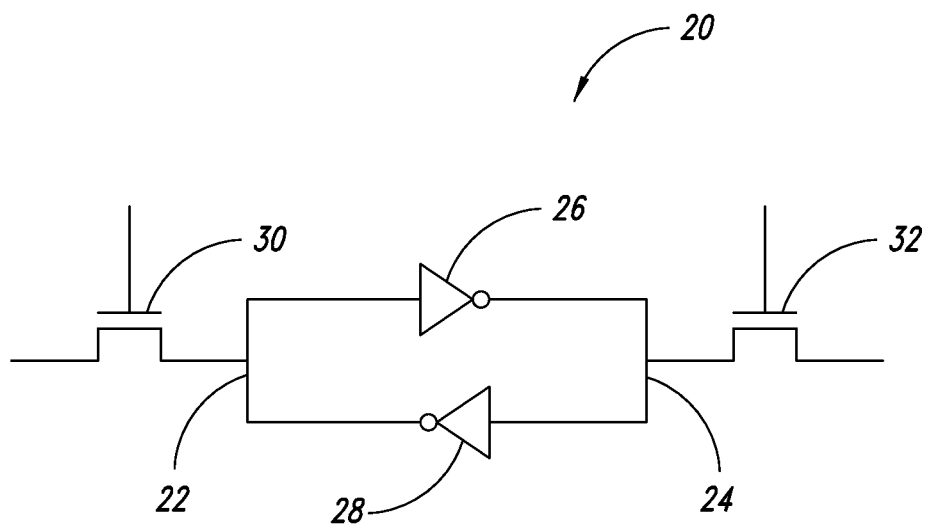
FIG. 1 shows a schematic diagram of a prior art SRAM cell.
Figure 2:
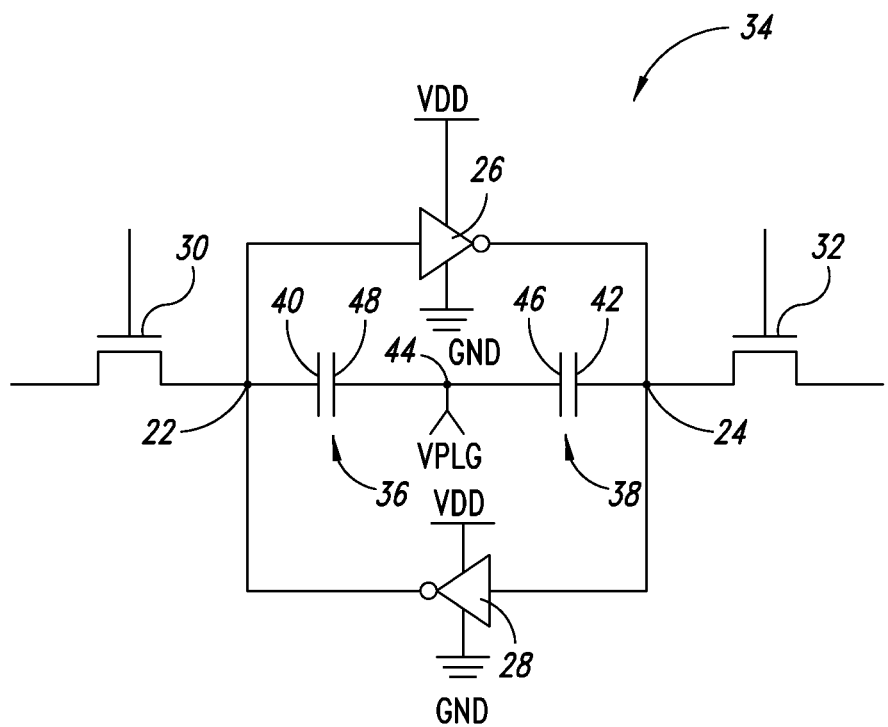
FIG. 2 shows a schematic diagram of an SRAM cell having two capacitors connected in series between the storage nodes according to the prior art.
Figure 3:
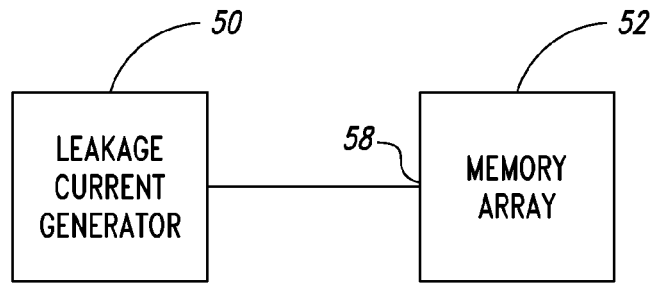
FIG. 3 is a block diagram of an SRAM with the storage node maintained by a leakage current generator according to one embodiment of the invention.

FIG. 3 illustrates a portion of a memory according to one embodiment. A memory cell 52 is coupled to a leakage current generator 50. The leakage current generator 50 supplies to the memory cell 52 a leakage current voltage, (LCV herein and in the figures). The leakage current generator 50 is configured to generate the leakage current voltage, LCV, while consuming very little power. In one embodiment the leakage current voltage is approximately midway between a high voltage supply and a low voltage supply.

Figure 4:
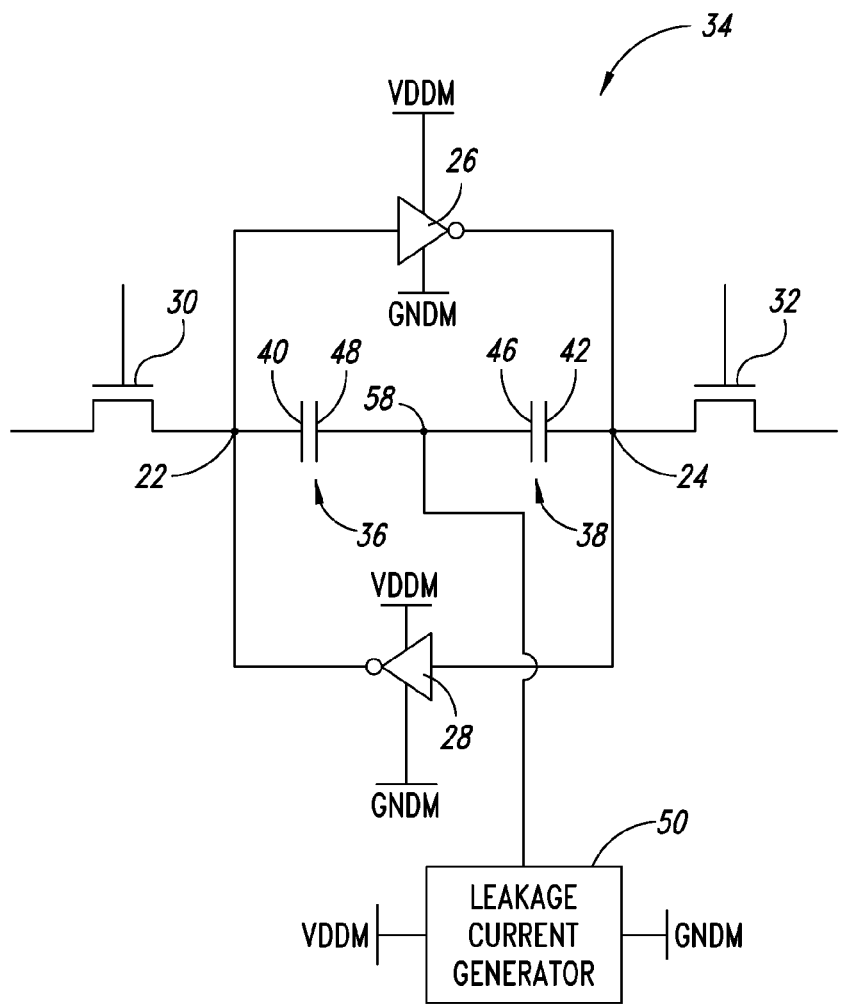
FIG. 4 is a block diagram of a portion of an SRAM array according to one embodiment of the invention.

FIG. 4 illustrates an SRAM memory cell according to one embodiment of the invention. The SRAM cell 34 of FIG. 4 comprises two capacitors 36, 38 coupled in series between the bit storage node 22 and the complementary bit node 24. The function of the two capacitors 36, 38 is to further reinforce the value stored at the bit storage node 22. When the bit storage node 22 is high, the first plate 40 of the first capacitor 36 charges to the high value. Stray electrons dragged to the bit storage node 22 by an alpha particle will not be enough to bring the bit storage node 22 low and rewrite the value stored in the cell 34 with the capacitors present. However, the capacitors may leak small amounts of current, therefore, the target it to ensure that sufficient current is provided to the capacitors that their voltage level does not drop due to parasitic losses or leakage. As long the capacitors are maintained at full charge, they ensure that the bit will not be rewritten by a soft error. If the bit storage node 22 is low, then the complementary bit storage node 22 is high and the first plate 42 of the second capacitor 38 is charged to the high value while the first plate 40 of the first capacitor 36 is brought low.

The power supply to the SRAM cell is VDDM and GNDM in one embodiment, which are shifted with respect to the high and low supply voltages, as explained later herein.

The second plates 46, 48 of the first and second capacitors 36, 38 are coupled together to a common node 58. The common node 58 of the second plates 46, 48 receive a leakage current from the leakage current generator 50. The value of the leakage current is selected to just slightly exceed the sum of parasitic and leakage loss from the capacitors. As long as the leakage current is in excess the loss current from the capacitors, they will be maintained at full voltage. The leakage current voltage, LCV, is approximately midway between the supply voltage VDDM and the supply voltage GNDM. Thus the second plates 46, 48 of the capacitors 36, 38 are continuously held at a voltage midway between the voltages on the first plates 40, 42. This configuration further reinforces the value stored at the bit storage node 22. A circuit to provide the reduced voltage VDDM and slightly raised voltage GNDM is shown and described in U.S. Pat. NO. 7,623,405, and pending application Ser. No. 12/029,366, both of which are incorporated herein by reference.

Figure 5:
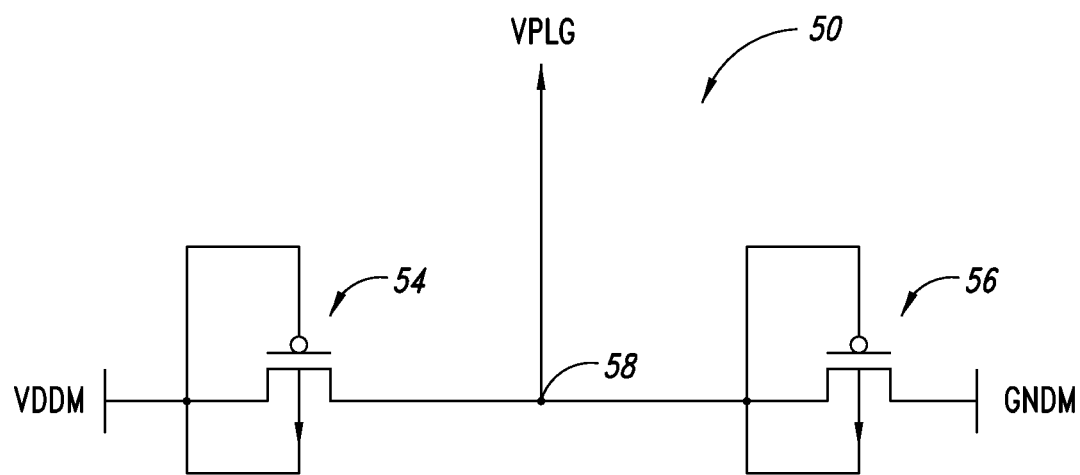
FIG. 5 is a schematic diagram of a leakage current generator according to one embodiment of the invention.

FIG. 5 illustrates a leakage current generator circuit 50 according to one embodiment. A first PMOS transistor 54 has its source, gate, and body coupled to a supply voltage VDDM. The drain of the first PMOS transistor 54 is coupled to the source, gate, and body of a second PMOS transistor 56 at a common node 58. The drain of the second PMOS transistor 56 is coupled to a supply voltage GNDM. A leakage current flowing between the source of the first PMOS transistor 54 and the drain of the second PMOS transistor 56 causes a midpoint voltage to appear at the common node 58. The midpoint voltage at the common node 58 is the capacitor supply voltage. In one embodiment, both the SRAM and the leakage current generator 50 are driven by full VDD and full ground that are available on the chip. In other embodiments, one or both of them are driven by voltages that are different from VDD and GND by a set amount.

Because the gate-source voltage of each PMOS transistor is 0V, the transistors are held in the off state. In the off state, the transistors are substantially non-conducting. However, even in the non-conducting state a small sub-threshold leakage current flows through the transistors. This small leakage current is utilized to generate the leakage current delivered to common node 58 which will supply sufficient current to exceed any small current that may leave the capacitors 36 and 38 by leakage or parasitic effects. Further, if the cell does experience noise that might cause a soft error, such as an alpha particle, the leakage current generator 50 will supply current to restore node 58 to the proper voltage. The first and the second PMOS transistors 54, 56 preferably have identical channel lengths and widths. This helps to ensure that the voltage drop across both transistors is identical. In this way the voltage appearing at the common node 58, is midway between the supply voltage VDDM and the supply voltage GNDM.

In one embodiment, the width of the channels of the PMOS transistors is 72 μm and the length of channels of the PMOS transistors is 190 nm. A large number of transistors 54 and 56 are connected in parallel to each other to form leakage current generator 50 having the proper number of transistors to provide the needed current to keep the voltage of common node 58 at the center value. In one embodiment in which the SRAM array is 8 Megabyte and a single leakage current generator 50 is used, there are 700 pairs of transistors 54 and 56 in parallel in order to provide the needed leakage current.

The target is to provide sufficient current to keep the node at the center point, but to not consume more power than needed to keep the capacitors charged. In this circuit, consuming low power that is still assured of being sufficient is desired, even if slightly more silicon space consumed. When the circuit is constructed, a number of parameters vary with the manufacturing process. According to one embodiment, a large array of transistor pairs 54 and 56 is constructed on the chip when the circuit is fabricated. Then, the circuit is tested to determine the number of transistors needed to provide sufficient replacement current and only that number is coupled into the circuit and the rest remain unused, consuming no power. As one example, 1000 pairs of PMOS transistors 54 and 56 may be formed on the chip during construction. The SRAM array is then tested and it is determined that about 600 pairs of PMOS transistors 54 and 56 are needed to be assured of maintaining node 58 at the proper voltage. These 600 pairs are coupled to node 58 by appropriate means, such as fuse connections. Alternatively, the unused 400 pairs are disconnected by blowing fuses and no power is consumed by them for the life of the circuit. Of course, as better capacitors are formed, less leakage current is needed to keep the voltage 58 at the proper value.

Any unused transistors do not draw any power, thus reducing substantially the power drain that would be used if all of them were connected. Circuits to alternatively connect or disconnect transistor banks by anti-fuses or by blowing fuses are well known in the art and thus need not be described here.

In some manufacturing processes only 300-400 transistors will be needed, while in others, over 800 may be needed, depending on the leakage and parasitic currents at node 58. Under ideal conditions, there is no current flow away from node 58, but semiconductor substrates generally have leakage and parasitic currents and this circuit compensates for such currents using a very low amount of power that, in one embodiment, is custom selected for each design after the circuit is built. According to one embodiment, a large array of transistors 54 and 56 are formed on the chip, the chip is tested after manufacture and only those number needed to keep the common node 58 at the correct voltage are coupled together to form the current generator 50.

The supply voltage VDDM can be identical to VDD or, in one embodiment, is substantially lower than VDD. In one embodiment, VDD is about 1.4V and GND is zero volts as ground. For a VDD of 1.4V and ground, the midpoint is 0.7V. In the embodiment in which VDDM is used, it may be about 0.9V or 0.95V. The supply voltage GNDM can be ground or in one embodiment is higher than the low supply voltage GND by approximately the same amount that VDDM is lower than VDD. Thus in one embodiment GNDM is about 0.25 or 0.3V. The midpoint for these two voltages will be approximately 0.6V. In this configuration, the same voltage VDDM and GNDM used to drive the SRAM is used to drive the leakage current generator 50. Thus, in this embodiment, the midpoint voltage between VDDM and GNDM is different than the midpoint voltage between VDD and GND, but since both the SRAM and the leakage current generator are both coupled to VDDM and GNDM for their power supplies, the circuit operates correctly. Alternatively, the values VDDM and GNDM can be selected to ensure that the node 58 will be approximately at the midpoint of VDD and GND.

The leakage current from generator 50 is supplied to the second plates 46, 48 of the first and second capacitors 36, 38 as shown in FIG. 4. The second plates 46, 48 of the capacitors 36, 38 are thus held at the midpoint voltage between VDDM and GNDM. Holding the second plates 46, 48 at the midpoint voltage helps to ensure that the voltages on the first plates 40, 42 are held steady until a valid write operation is performed to change the values stored in the bit storage node 22 and the complementary bit node 24.

Figure 6:
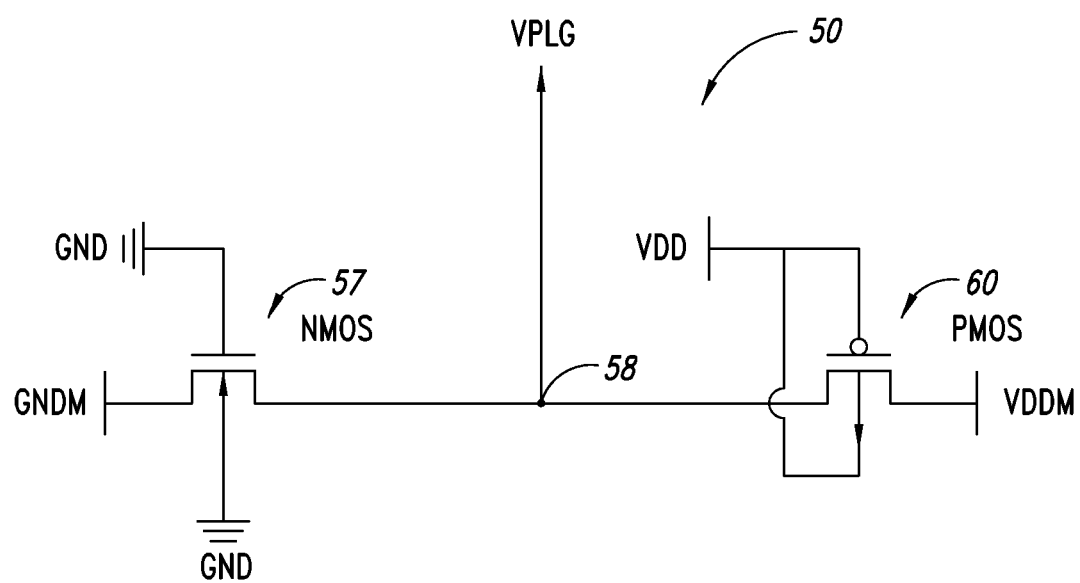
FIG. 6 is a schematic diagram of a leakage current generator according to an alternative embodiment of the invention.

FIG. 6 illustrates a leakage current generator 50 according to a possible alternate embodiment. An NMOS transistor 57 has a source coupled to GNDM. The gate and body of the NMOS transistor 57 are coupled to GND. The drain of the NMOS transistor 57 is coupled to the drain of a PMOS transistor 60 at the common node 58. The source of the PMOS transistor 60 is coupled to VDDM. The body and gate of the PMOS transistor 60 are coupled to VDD. A leakage current flowing between the source of the PMOS transistor 60 and the source of the NMOS transistor 57 causes a midpoint voltage to appear at the common node 58. The midpoint voltage at the common node 58 is the leakage current voltage LCV.

Because the gate voltage of the PMOS transistor 60 is held higher than the source voltage of the PMOS transistor 60, the PMOS transistor 60 is held in the off state. Because the gate voltage of the NMOS transistor 57 is held lower than the source voltage of the NMOS transistors 57 the NMOS transistor 57 is held in the off state. In the off state, the transistors 57, 60 are substantially non-conducting. However, even in the non-conducting state small sub-threshold leakage currents flow through the transistors 57, 60. These small leakage currents are utilized to generate the leakage current voltage LCV at the common node 58. In one embodiment the NMOS transistor 57 and the PMOS transistor 60 are sized and doped so that the voltage drop across each transistor due to the leakage currents is the same. In one embodiment the length of the channel of the PMOS transistor 60 is 250 nm and the channel width of the PMOS transistor 60 is 119 μm. In one embodiment the width of the channel of the NMOS transistor 57 is 34 μm and the channel length of the NMOS transistor 57 is 250 nm.

As discussed regarding FIG. 5 the leakage current voltage LCV is supplied to the second plates 46, 48 of the first and second capacitors 36, 38. The second plates 46, 48 of the capacitors 36, 38 are thus held at the midpoint voltage between VDDM and GNDM. Holding the second plates 46, 48 at the midpoint voltage helps to ensure that the voltages on the first plates 40, 42 are held steady until a valid write operation is performed to change the values stored in the bit storage node 22 and the complementary bit node 24.

Figure 7:
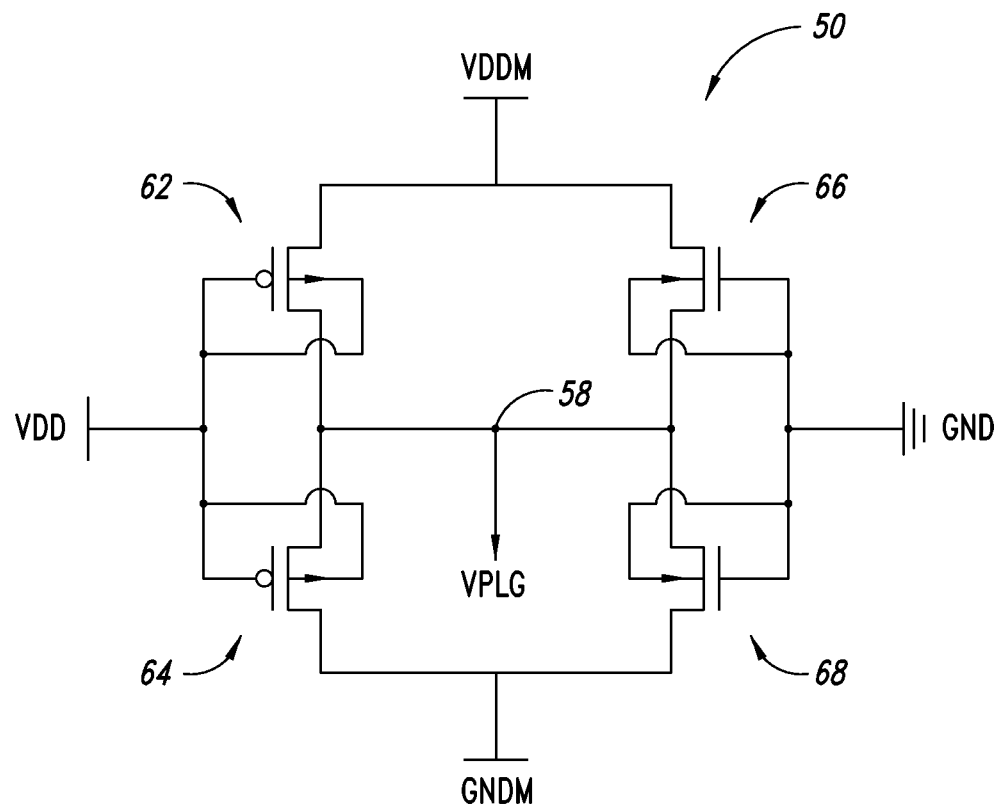
FIG. 7 is a schematic diagram of a leakage current generator according to one embodiment of the invention.

FIG. 7 illustrates an alternative embodiment of the capacitor supply voltage generator. The source of a first PMOS transistor 62 is connected to VDDM. The drain of the first PMOS transistor 62 is connected to the source of a second PMOS transistor 64 at a common node 58. The gates and bodies of the first and second PMOS transistors 62, 64 are connected to VDD. The drain of the second PMOS transistor 64 is connected to GNDM. The drain of a first NMOS transistor 66 is connected to VDDM. The source of the first NMOS transistor 66 is connected to the drain of a second NMOS transistor 68 at the common node 58. The gates and bodies of the first and second NMOS transistors 66, 68 are connected to GND. The source of the second NMOS transistor 68 is connected to GNDM. Leakage currents flowing through the transistors 62, 64, 66, 68 from VDDM to GNDM cause a midpoint voltage to appear at the common node 58. The midpoint voltage at the common node 58 is the leakage current voltage LCV.

Because the gate voltage of the PMOS transistors 62, 64 is held higher than the source voltages of the PMOS transistor 62, 64, the PMOS transistors 62, 64 are held in the off state. Because the gate voltage of the NMOS transistors 66, 68 are held lower than the source voltage of the NMOS transistors 66, 68 the NMOS transistors 66, 68 are held in the off state. In the off state, the transistors 62, 64, 66, 68 are substantially non-conducting. However, even in the non-conducting state small sub-threshold leakage currents flow through the transistors 62, 64, 66, 68. These small leakage currents are utilized to generate the leakage current voltage LCV at the common node 58. In one embodiment the NMOS transistors 66, 68 and the PMOS transistors 62, 64 are sized and doped so that the voltage drop across each transistor due to the leakage currents is the same. In one embodiment the lengths of the channels of transistors 62, 64, 66, 68 are 250 nm and the widths of the channels of the transistors 62, 64, 66, 68 are 38 μm. As in the other embodiments, and array of such transistors is provided and the proper number to generate the needed leakage current are coupled to the common node 58 and the other transistors are not connected and consume no power.

As discussed regarding FIGS. 5 and 6, the leakage current voltage LCV is supplied to the second plates 46, 48 of the first and second capacitors 36, 38. The second plates 46, 48 of the capacitors 36, 38 are thus held at the midpoint voltage between VDDM and GNDM. Holding the second plates 46, 48 at the midpoint voltage helps to ensure that the voltages on the first plates 40, 42 are held steady until a valid write operation is performed to change the values stored in the bit storage node 22 and the complementary bit node 24.

Figure 8:
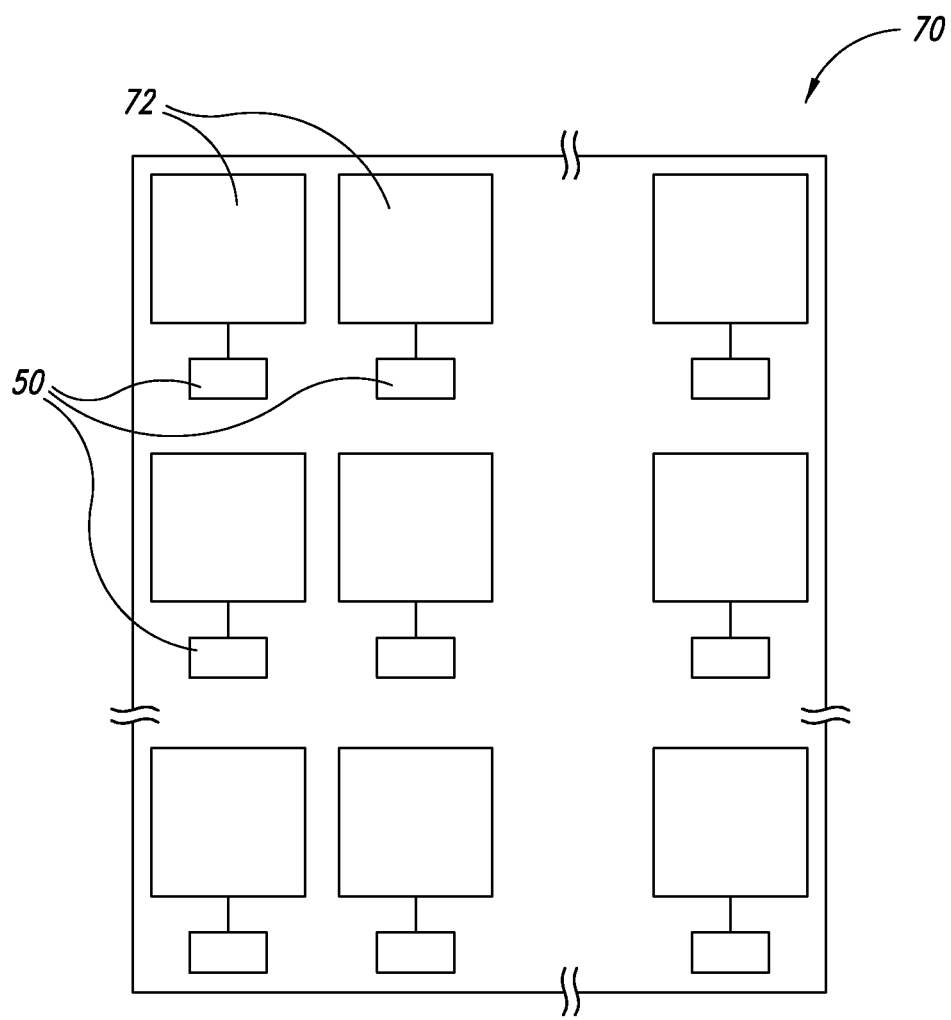
FIG. 8 is a block diagram illustrating separate blocks of SRAM cells coupled to respective leakage current generators according to one alternative embodiment of the invention.

FIG. 8 is a simplified block diagram of one alternative embodiment of an SRAM memory 70. According to this alternative, the memory 70 comprises a plurality of blocks 72 of memory cells. Each block 72 of memory cells is coupled to a respective capacitor voltage supply generator 50. The capacitor supply voltage generators 50 each generate a leakage current voltage LCV at a midpoint between either a high supply voltage rail VDD and a low supply voltage rail GND or a reduced supply VDDM and ground GNDM, as described regarding the embodiments described in relation to FIGS. 4-7 or any other suitable embodiments. Each memory cell in a block 72 of memory cells is an SRAM memory cell having capacitors 36, 38 as illustrated in FIG. 4. A single leakage current supply generator 50 provides the leakage current voltage LCV to all of the memory cells in the block 72 that the generator 50 is connected to.

Capacitors commonly leak tiny amounts of charge and must be recharged in order to maintain their desired voltage. Some small percentage of the capacitors in the blocks 72 of the memory 70 can be expected to be somewhat faulty and leak more charge than normal. The expected leakage of a block of capacitors can be easily obtained by performing tests on one or more devices made by the process to be used in manufacturing the memory 70. Using these diagnostics, the transistors in the generators 50 can be sized, doped, and biased to generate a leakage current sufficient to generate the leakage current voltage LCV and to supply a small current to continually replenish the leakage of the capacitors. In this way, the power efficiency of the memory can be maximized. An SRAM according to the several embodiments can provide adequate protection against the occurrence of soft errors while also being extremely power efficient. Because the generators 50 supply the capacitors with a voltage and current generated only from a calibrated leakage current that has been tested to ensure operation but to not consume more power than needed, the SRAM 70 can be extremely power efficient.

Figure 9:
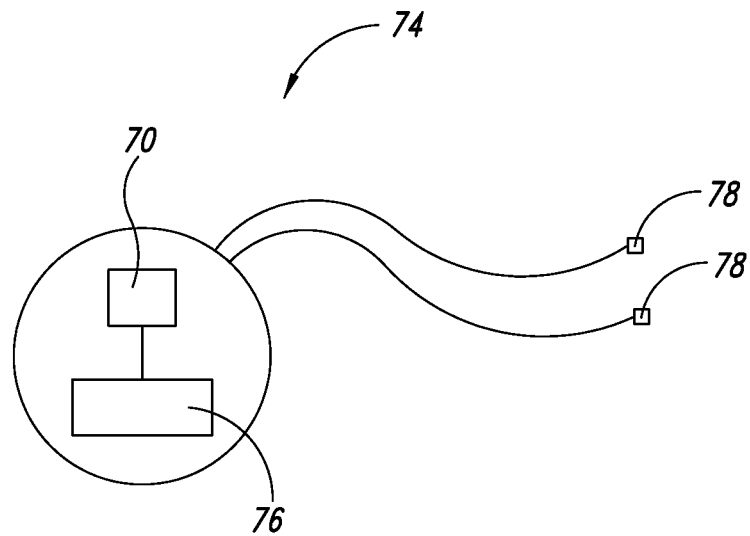
FIG. 9 is a top view of an internal medical device according to one embodiment of the invention.

FIG. 9 illustrates an internal defibrillator 74 according to one embodiment. The internal defibrillator 74 is implanted internally in a person with serious cardiac problems. Electrodes 78 are generally placed in the heart and are used to sense arrhythmia in the heart. When an arrhythmia is detected, the electrodes can deliver a powerful electrical shock to induce the heart to beat properly. A battery 76 supplies power to the electrodes 78 and to a memory 70. In one embodiment the memory 70 is the SRAM memory 70 of FIG. 8. The SRAM memory 70 stores data used to ensure the proper operation of the defibrillator 78. It is very important that the battery 76 does not fail. For this reason, the SRAM must be very power efficient. A malfunction of the internal defibrillator could be fatal to the person in whom the defibrillator 78 is installed. Thus the highly efficient and robust SRAM memory 70 described in relation to the various embodiments is very advantageous to the internal defibrillator 74. Of course, the SRAM memory 70 could be installed in any other sensitive device which requires high device integrity and power efficiency such as an internal pacemaker or other medical devices. The SRAM memory 70 could be used in any suitable electronic device, whether portable or stationary.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a memory cell having:
      a first capacitor; and
      a second capacitor in series with the first capacitor, the first and second capacitors being coupled together at a common node;
   a first transistor connected in the off condition; and
   a second transistor connected in the off condition, the second transistor coupled in series with the first transistor, the first and second transistors connected to always be off and to supply to the common node a capacitor supply voltage, the first transistor configured to generate the capacitor supply voltage by a leakage current of the first transistor in the off condition.

2. The device of claim 1 wherein the memory cell is an SRAM memory cell having a first inverter, the first and second capacitors being coupled in series between an input and an output of the first inverter.

3. The device of claim 1 wherein the capacitor supply voltage is approximately midway between a voltage of a first supply rail and a voltage of a second supply rail.

4. The device of claim 3 wherein the first and the second transistors are in series between a first voltage supply and a second voltage supply.

5. The device of claim 4 wherein a voltage difference between the first voltage supply and second voltage supply is smaller than a voltage difference between a first supply rail and a second supply rail.

6. A memory comprising:
   a plurality of SRAM memory cells, each SRAM memory cell respectively comprising:
      an inverter;
      a first capacitor; and
      a second capacitor in series with the first capacitor and sharing a common node with the first capacitor; and
   a voltage generator having a first transistor and configured to supply to the common node of each respective SRAM memory cell a capacitor supply voltage, the capacitor supply voltage being approximately midway between a high voltage supply level of the memory and a low voltage supply level of the memory, the first transistor being configured to generate the capacitor supply voltage by a leakage current of the first transistor.

7. The memory of claim 6 wherein the leakage current of the first transistor compensates for a leakage of at least one of the first or second capacitors.

8. The memory of claim 6 wherein the voltage generator comprises a second transistor in series with the first transistor, the first and the second transistors being off.

9. The memory of claim 8 wherein the first transistor is coupled to the high voltage supply level and the second transistor is coupled to the low voltage supply level.

10. A device comprising:
    a memory cell having an inverter, the inverter having an input and an output;
    a first capacitor having a first node and a second node, the first node of the first capacitor being coupled to the input of the inverter;
    a second capacitor having a first node and a second node, the second node of the second capacitor being coupled to the second node of the first capacitor, the first node of the second capacitor being coupled to the output of the inverter; and
    a voltage generator having a first transistor with a gate held at an off voltage level and coupled to supply to the second nodes of the first and second capacitors a capacitor supply voltage generated from a leakage current of the first transistor.

11. The device of claim 10 wherein the voltage generator comprises a second transistor in series with the first transistor, the first and second transistors being coupled at a common node to the second nodes of the first and second capacitors.

12. The device of claim 11 wherein the first and second transistors are PMOS transistors, a drain of the first transistor being coupled at the common node to a source of the second transistor.

13. The device of claim 12 wherein a source of the first transistor is coupled to a high voltage supply of the device, a drain of the second transistor being coupled to a low voltage supply of the device.

14. The device of claim 13 wherein a gate and a body of the first transistor are coupled to the high voltage supply, a gate and a body of the second transistor being coupled to the common node.

15. The device of claim 10 wherein the first transistor is an NMOS transistor and the second transistor is a PMOS transistor.

* * * * *